（12） United States Patent
Foster, Sr. et al.

(10) Patent No.: US 7,085,134 B2
(45) Date of Patent: Aug. 1, 2006

(54) DUAL FAN HEAT SINK

(75) Inventors: Jimmy Grant Foster, Sr., Morrisville, NC (US); Michael Sean June, Raleigh, NC (US); Albert Vincent Makley, Raleigh, NC (US); Jason Aaron Matteson, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 97 days.

(21) Appl. No.: 10/881,339

(22) Filed: Jun. 30, 2004

(65) Prior Publication Data

US 2006/0002082 A1 Jan. 5, 2006

(51) Int. Cl.
*H05K 7/20* (2006.01)

(52) U.S. Cl. .................. 361/695; 361/697; 361/704; 165/80.3; 257/721; 257/722; 174/16.3

(58) Field of Classification Search ............. 361/695, 361/704, 709; 257/721–722; 174/16.1, 174/16.2; 165/80.3, 185
See application file for complete search history.

(56) References Cited

U.S. PATENT DOCUMENTS 5,787,971 A    8/1998  Dodson
6,097,601 A *  8/2000  Lee ............................ 361/704
6,308,771 B1 * 10/2001 Tavassoli .................... 165/80.3
6,450,251 B1 *  9/2002 Lin et al. .................... 165/122
6,501,651 B1   12/2002 Lin et al.
6,512,673 B1    1/2003 Wiley
6,533,028 B1 *  3/2003 Sato .......................... 165/80.3
6,598,667 B1 *  7/2003 Kuo .......................... 165/80.3
6,691,768 B1 *  2/2004 Hsieh et al. ............... 165/80.3
6,819,564 B1 * 11/2004 Chung et al. ............... 361/697
6,899,164 B1 *  5/2005 Li et al. ..................... 165/80.3
2003/0128513 A1 7/2003 Wiley

FOREIGN PATENT DOCUMENTS

JP         9307034 A     11/1997

* cited by examiner

*Primary Examiner*—Boris Chervinsky
(74) *Attorney, Agent, or Firm*—Martin J. McKinley; Dillon & Yudell LLP

(57) ABSTRACT

A heat sink having graduated lengths of fins, with the tallest fins being in the center of the heat sink to provide maximum heat removal from a mated integrated circuit (IC) chip. Dual fans impinge air against the fins, and particularly the tallest fins, to provide a highly efficient system for heat removal from the IC chip. By reducing the size of the lateral fins, additional space is made available for the dual fans. The use of the dual fans allows the fans to run at a lower speed that a single fan, thus reducing an overall fan acoustic level. Furthermore, the dual fans allow for a backup fan system if one of the fans should fail.

15 Claims, 3 Drawing Sheets

DUAL FAN HEAT SINK

BACKGROUND OF THE INVENTION

1. Technical Field

The present invention relates in general to the field of electronics, and in particular to electronic chips that generate extraneous heat during normal operation. More particularly, the present invention relates to a method and system for conducting heat away from an integrated circuit, which still more particularly may be a microprocessor.

2. Description of the Related Art

In a typical personal computer (PC), the main heat-generating component among the logic circuits is the processor, also referred to as the Central Processing Unit (CPU) or microprocessor (MP). As illustrated in FIG. 1a, a processor 102 is mounted in a socket 104, which is mounted on a (printed) circuit board 106 by mating pins 108 from the processor 102 into the socket 104. As processors continue to grow in performance, so does the heat generated by the processors. To remove heat from processor 102, a heat sink (HS) 110, having a HS base 112 and a plurality of fins 114, is secured to processor 102 by a strap 116 of other attachment means. Heat is conducted from the processor 102 to the HS base 112 and the fins 114, which dissipate heat by conduction and convection to ambient air surrounding fins 114. To provide thermal conduction between of top surface 120 of processor 102 and the HS base 112, thermal grease 118, typically a thermally conductive silicon or filled hydrocarbon grease doped with fillings such as metals, is used.

A major problem with the heat sink 110 shown in FIG. 1a is that it relies on conduction to the ambient air, which may or may not be moving significantly enough to convey heat away, depending on movement of air about the heat sink caused by fan(s) in a computer case that houses the processor 102. To aid in this movement, a heat sink fan 122, as shown in FIG. 1b, is often used. Heat sink fan 122 includes fan blades 124 that rotate about a hub 126. Thus, there is a "dead space" below hub 126 in which there is minimal air movement. This is especially problematic since it is typically the center of processor 102 that generates the most heat. Thus, the area of processor 102 and its adjacent HS base 112 that needs the most cooling actually receives the least amount of help from heat sink fan 122.

What is needed therefore is a device that provides maximum cooling to the center portion of processor 102 and HS base 112, preferably within the same physical dimensions as used by a conventional heat sink fan 122.

SUMMARY OF THE INVENTION

The present invention is therefore directed to a heat sink having graduated lengths of fins, with the tallest fins being in the center of the heat sink to provide maximum heat removal from a mated integrated circuit (IC) chip. Dual fans impinge air against the fins, and particularly the tallest fins, to provide a highly efficient system for heat removal from the IC chip. By reducing the size of the lateral fins, additional space is made available for dual fans. The use of dual fans allows the fans to run at a lower speed than a single fan, thus reducing an overall fan acoustic level. Furthermore, the dual fans allow for a backup fan if one of the fans should fail.

The above, as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further purposes and advantages thereof, will best be understood by reference to the following detailed description of an illustrative embodiment when read in conjunction with the accompanying drawings, where:

FIG. 3 depicts the inventive heat sink having graduated sized fins and dual heat sink fans.

DETAILED DESCRIPTION OF A PREFERRED EMBODIMENT

Figure 1A:
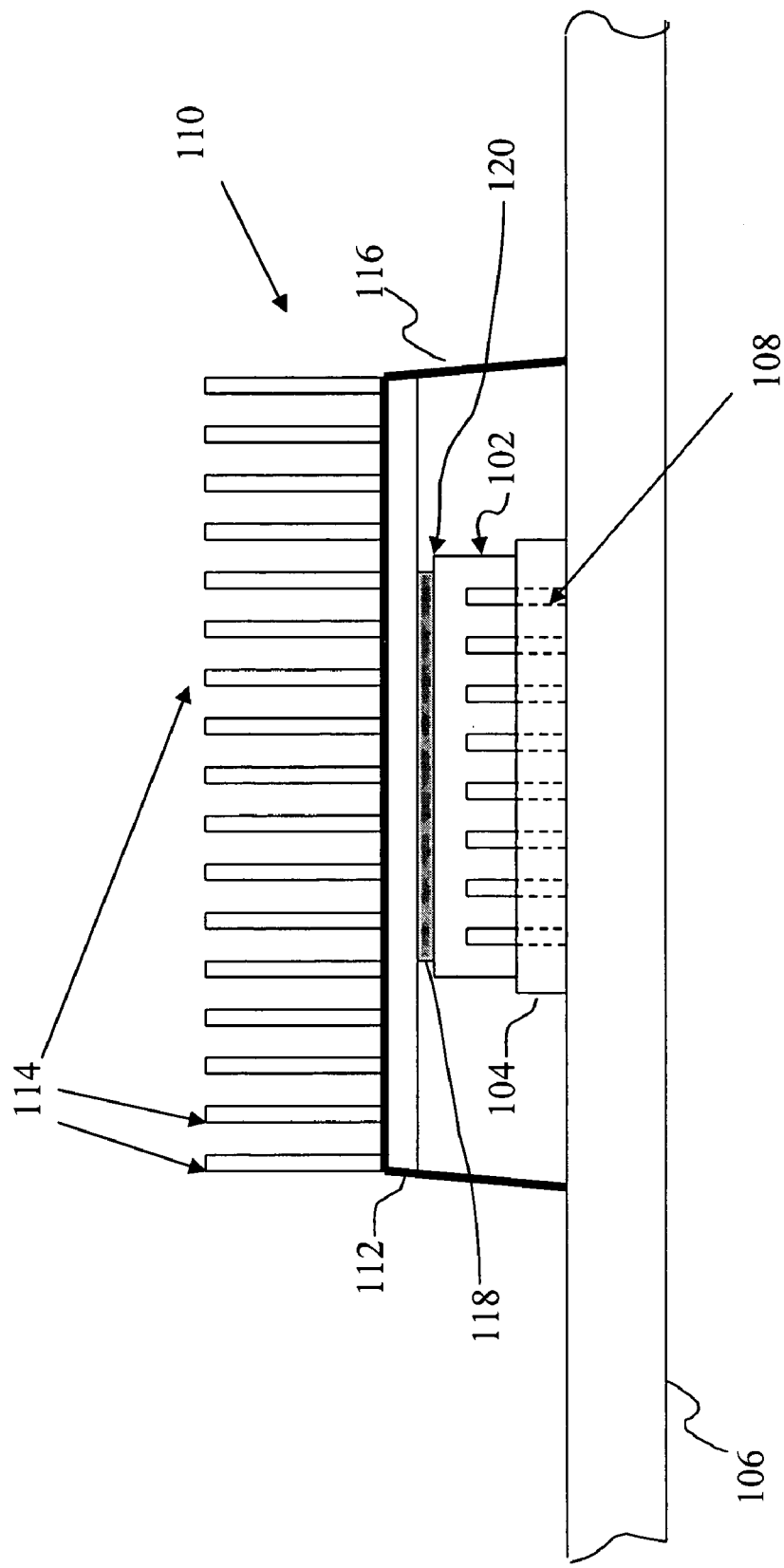
FIG. 1a depicts a prior art heat sink mounted against an integrated circuit (IC) chip package.
Figure 1B:
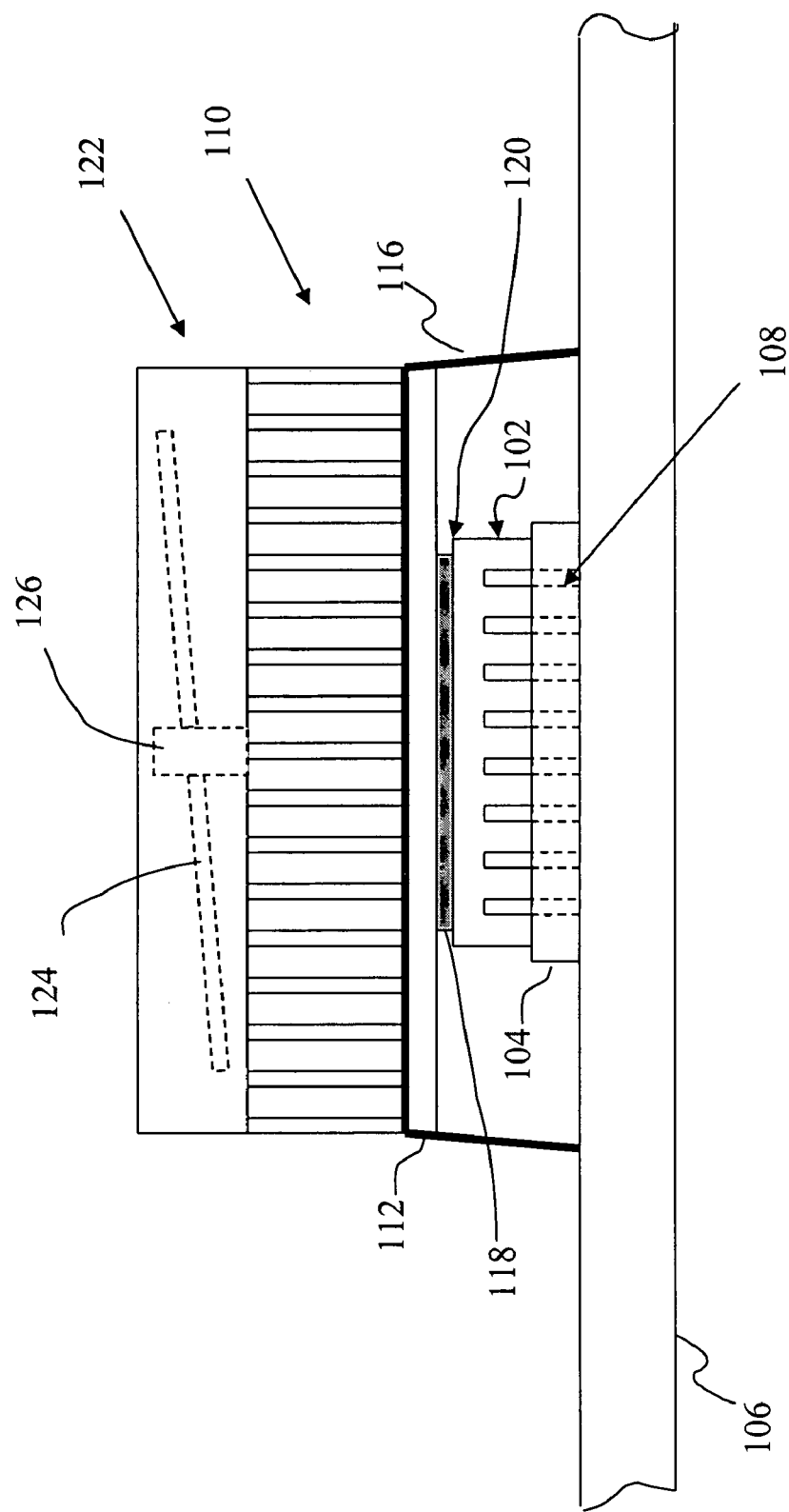
FIG. 1b illustrates the prior art heat sink with a conventional heat sink fan.
Figure 2:
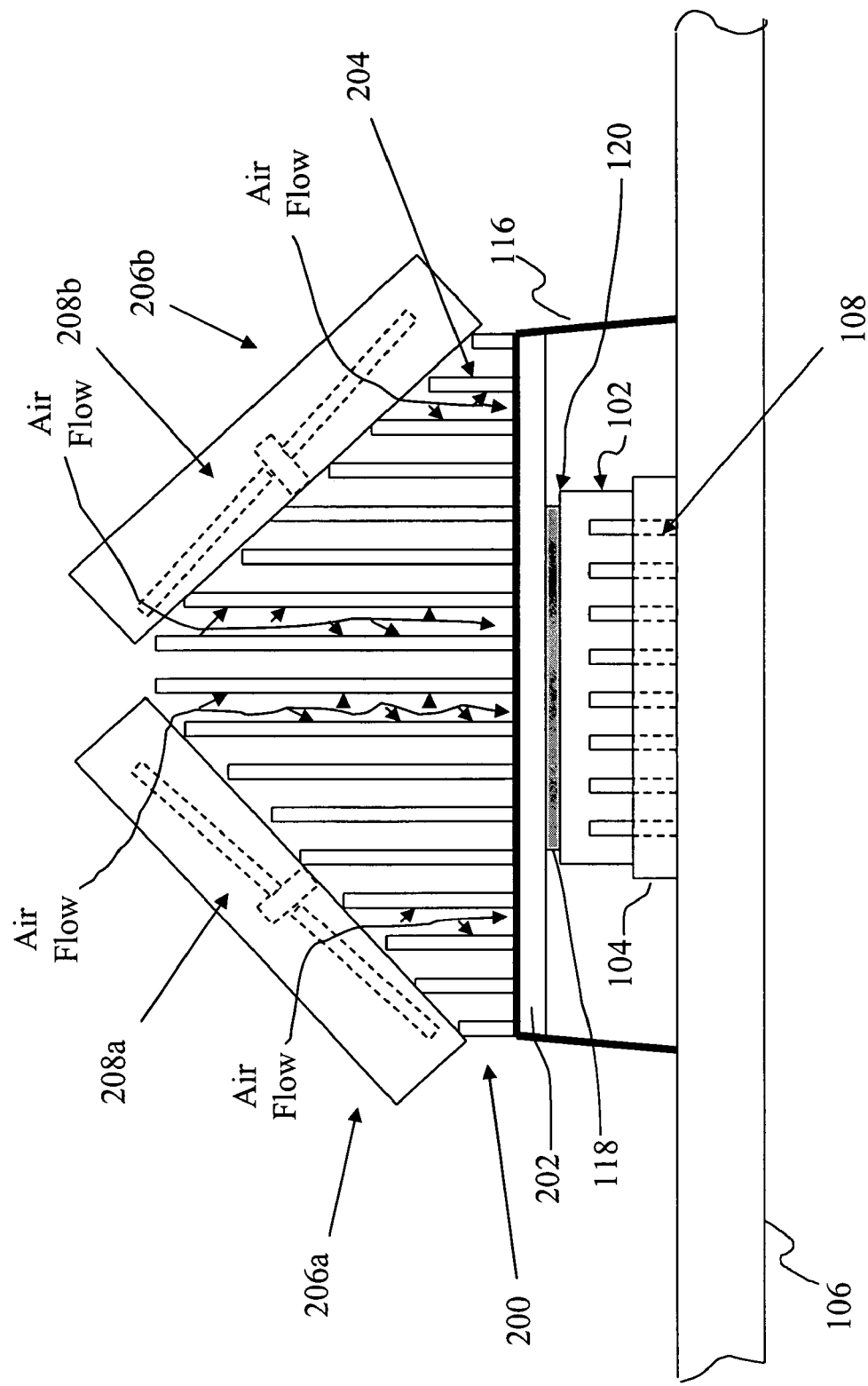

With reference now to FIG. 2, there is depicted a side view of a novel graduated heat sink 200. Graduated heat sink 200 has a base 202, to which multiple graduated fins 204 are mounted, preferably being mounted normal (perpendicular) to the top of base 202. Heat sink 200 is secured above and against processor 102 in any manner known to those skilled in the art of heat sinks, including the manner described above for FIG. 1a, and will not be reiterated here.

Note that the center of base 202 is oriented above processor 102 such that the graduated fins 204 of the greater length are oriented above the center of the top of processor 102, while the graduated fins 204 of the lesser length are oriented about the periphery of base 202, and thus are above or offset to the edges of the top of processor 102. This orientation is significant since it is the center of processor 102 that generates more heat than the periphery of processor 102. Thus, the graduated fins 204 having the greater length are able to remove more heat than the graduated fins 204 having the lesser length.

The graduated fins 204 of the greater length are able to remove more heat than the graduated fins 204 of the lesser length due to the increased amount of air being impinged against the graduated fins 204 of the greater length. That is, the heat sink fans 206, having fan blades 208, force (impinge) air against the graduated fins 204. Since the graduated fins 206 of the greater length have more surface area against which air is impinged, then these fins are able to conduct more heat away than the graduated fins 204 having the lesser length, as is understood by those skilled in the art of thermodynamics and heat removal.

Again, orienting the graduated fins 204 having the greater length above the center of the top of processor 102 takes advantage of the greater length graduated fins' 204 ability to remove heat where such removal is needed the most.

Having dual heat sink fans 206 provides two benefits. First, by having two fans instead of one fan, the two fans are able to operate at a lower speed (RPM) than a single fan, thus reducing the amount of vibration and noise created by the two fans. Second, the two fans allows one of the heat sink fans 206a to be a backup to the other heat sink fan 206b, in case heat sink fan 206a should fail. Third, heat sink fan 206b may optionally be turned on only if heat sink fan 206a is unable to provide adequate cooling of processor 102, as determined and measured by any technique known to those skilled in the art of processor temperature control.

The present invention therefore provides a quiet and efficient method of removing heat from an IC chip. Since the outer fins are of the lesser length do not need to be as efficient in air impingement as the inner fins of the greater length, useless material on the outer fins is eliminated, leaving more space for the dual fans, thus requiring little additional room for two fans compared to one fan used with a prior art heat sink (that has uniform sized fins).

While the invention has been particularly shown and described with reference to a preferred embodiment, it will be understood by those skilled in the art that various changes in form and detail may be made therein without departing from the spirit and scope of the invention. For example, while the inventive heat sink has been described as removing heat from a processor, the invention is also beneficial in removing heat from any heat generating device, and particularly any heat generating integrated circuit package. Furthermore, while terms such as "above" and "beneath" have been used to describe the spatial orientation and movement of different components, such terms are used generically, and the present invention as described and claimed is to include orientations so generally described, but not limited to such "up/down" definitions.

What is claimed is:

1. A system comprising:
    a heat sink having:
        a heat sink base, wherein the heat sink base has a planar shape;
        a plurality of graduated length fins, wherein fins of a greater length are oriented against a center of the heat sink base, and wherein fins of a lesser length are oriented against a periphery of the heat sink base, and wherein the fins are all oriented in parallel to one another, and wherein the fins are all attached to and are oriented perpendicular to a top planar surface of the heat sink base; and
        a plurality of heat sink fans, wherein a first heat sink fan is oriented against a first group of the graduated length fins, and wherein a second heat sink fan is oriented against a second group of the graduated length fins, and wherein the orientation of the first and second heat sink fans cause a greater amount of air from the heat sink fans to impinge against all fins having the greater length and a lesser amount of air from the heat sink fans to impinge against the fins having the lesser length, and wherein air from the heat sink fans impinges against and is directed towards sides of the plurality of graduated length fins from a direction that is non-parallel with the fins.

2. The system of claim 1, wherein the first heat sink fan is a backup fan to the second heat sink fan in the event that the second heat sink fan should fail.

3. The system of claim 1, wherein the first heat sink fan is a supplemental fan to the second heat sink fan in the event that the second heat sink fan is unable to provide sufficient impinging air movement against the graduated heat sink fins.

4. The system of claim 3, wherein the first heat sink fan operates at a higher speed when the second heat sink fan is turned off, and wherein the first and second heat sink fans both operate at a same lower speed when the first and second heat sink fans are both turned on.

5. The system of claim 1, wherein airflow from the beat sink fans oscillates against two adjacent fins while moving towards the heat sink base.

6. A heat sink comprising:
    a heat sink base, wherein the heat sink base has a planar shape;
    a plurality of graduated length fins, wherein fins of a greater length are oriented against a center of the heat sink base, and wherein fins of a lesser length are oriented against a periphery of the heat sink base, and wherein the fins are all oriented in parallel to one another, and wherein the fins are all attached to and are oriented perpendicular to a top planar surface of the heat sink base and;
    a plurality of heat sink fans, wherein a first heat sink fan is oriented against a first group of the graduated length fins, and wherein a second heat sink fan is oriented against a second group of the graduated length fins, and wherein the orientation of the first and second heat sink fans cause a greater amount of air from the heat sink fans to impinge against all fins having the greater length and a lesser amount of air from the heat sink fans to impinge against the fins having the lesser lenght, and wherein air from the heat sink fans impinges against and is directed towards sides of the plurality of graduated length fins from a direction that is non-parallel with the fins.

7. The heat sink of claim 6, wherein the first heat sink fan is a backup fan to the second heat sink fan in the event that the second heat sink fan should fail.

8. The heat sink of claim 6, wherein the first heat sink fan is a supplemental fan to the second heat sink fan in the event that the second heat sink fan is unable to provide sufficient impinging air movement against the graduated heat sink fins.

9. The heat sink of claim 8, wherein the first heat sink fan operates at a higher speed when the second heat sink fan is turned off, and wherein the first and second heat sink fans both operate at a same lower speed when the first and second heat sink fans are both turned on.

10. The heat sink of claim 6, wherein airflow from the heat sink fans oscillates against two adjacent fins while moving towards the heat sink base.

11. A method comprising:
    mounting a heat sink against a heat generating package, the heat sink having:
        a heat sink base, wherein the heat sink base has a planar shape;
        a plurality of graduated length fins, wherein fins of a greater length are oriented against a center of the heat sink base, and wherein fins of a lesser length are oriented against a periphery of the heat sink base, and wherein the fins are all oriented in parallel to one another, and wherein the fins are all attached to and are oriented perpendicular to a top planar surface of the heat sink base; and
        a plurality of heat sink fans, wherein a first heat sink fan is oriented against a first group of the graduated length fins, and wherein a second heat sink fan is oriented against a second group of the graduated length fins, and wherein the orientation of the first and second heat sink fans cause a greater amount of air from the heat sink fans to impinge against all fins having the greater length and a lesser amount of air from the heat sink fans to impinge against the fins having the lesser length, and wherein air from the heat sink fans impinges against and is directed towards sides of the plurality of graduated length fins from a direction that is non-parallel with the fins.

12. The method of claim 11, wherein the first heat sink fan is a backup fan to the second heat sink fan in the event that the second heat sink fan should fail.

13. The method of claim 11, wherein the first heat sink fan is a supplemental fan to the second heat sink fan in the event that the second heat sink fan is unable to provide sufficient impinging air movement against the graduated heat sink fins.

14. The method of claim 11, wherein airflow from the heat sink fans oscillates against two adjacent fins while moving towards the heat sink base.

15. The method of claim 13, wherein the first heat sink fan operates at a higher speed when the second heat sink fan is turned off, and wherein the first and second heat sink fans both operate at a same lower speed when the first and second heat sink fans are both turned on.

* * * * *